(12) United States Patent
Kitamura et al.

(10) Patent No.: US 12,046,487 B2
(45) Date of Patent: Jul. 23, 2024

(54) SUBSTRATE TREATMENT APPARATUS AND SUBSTRATE TREATMENT METHOD

(71) Applicant: Kioxia Corporation, Tokyo (JP)

(72) Inventors: Yoshinori Kitamura, Tsu (JP);
Katsuhiro Sato, Yokkaichi (JP);
Hiroaki Ashidate, Mie (JP)

(73) Assignee: Kioxia Corporation, Tokyo (JP)

( * ) Notice: Subject to any disclaimer, the term of this patent is extended or adjusted under 35 U.S.C. 154(b) by 289 days.

(21) Appl. No.: 17/315,830

(22) Filed: May 10, 2021

(65) Prior Publication Data
US 2021/0265181 A1  Aug. 26, 2021

Related U.S. Application Data

(62) Division of application No. 15/254,505, filed on Sep. 1, 2016, now abandoned.

(30) Foreign Application Priority Data

Apr. 22, 2016 (JP) .................................. 2016-086377

(51) Int. Cl.
| | | |
|---|---|---|
| H01L 21/67 | (2006.01) | |
| B01F 23/23 | (2022.01) | |
| B05D 1/18 | (2006.01) | |
| B05D 1/34 | (2006.01) | |
| H01L 21/311 | (2006.01) | |

(52) U.S. Cl.
CPC ........ H01L 21/67086 (2013.01); B01F 23/23 (2022.01); B05D 1/18 (2013.01); B05D 1/34 (2013.01); H01L 21/31105 (2013.01); H01L 21/31111 (2013.01)

(58) Field of Classification Search
CPC ......... H01L 21/67086; H01L 21/31105; H01L 21/31111; B01F 23/23; B05D 1/18; B05D 1/34
See application file for complete search history.

(56) References Cited

U.S. PATENT DOCUMENTS 4,980,017 A * 12/1990 Kaji .................. H01L 21/67075
216/99
5,730,162 A * 3/1998 Shindo .............. H01L 21/67781
414/937

(Continued)

FOREIGN PATENT DOCUMENTS

| JP | 02-096334 A | 4/1990 |
| JP | 4-171724 A | 6/1992 |

(Continued)

OTHER PUBLICATIONS

JP-4393021-B2, Haga S, Machine Translation. (Year: 2023).*

*Primary Examiner* — Duy N Deo
*Assistant Examiner* — Christopher Remavege
(74) *Attorney, Agent, or Firm* — Oblon, McClelland, Maier & Neustadt, L.L.P.

(57) ABSTRACT

According to embodiments, a substrate treatment apparatus includes a housing, a heater and a pipe. The housing stores solution containing phosphoric acid and houses a substrate including a silicon substrate. The heater heats the solution over a normal boiling point of the solution. The pipe supplies heated solution heated by the heater into the housing while generating air bubbles.

4 Claims, 8 Drawing Sheets

(56) References Cited

U.S. PATENT DOCUMENTS

| | | | |
|---|---|---|---|
| 5,868,898 A * | 2/1999 | Liu | H01L 21/67075 |
| | | | 134/100.1 |
| 5,914,281 A | 6/1999 | Abe et al. | |
| 6,054,062 A * | 4/2000 | Calio | H01L 21/67075 |
| | | | 216/84 |
| 6,087,273 A * | 7/2000 | Torek | H01L 21/31111 |
| | | | 216/99 |
| 6,497,785 B2 * | 12/2002 | Huang | H01L 21/67086 |
| | | | 156/345.22 |
| 7,468,325 B2 * | 12/2008 | Kwon | H01L 21/0206 |
| | | | 438/747 |
| 7,648,580 B2 * | 1/2010 | Nakatsukasa | H01L 21/67028 |
| | | | 134/1 |
| 8,821,752 B2 | 9/2014 | Cho et al. | |
| 9,818,904 B2 * | 11/2017 | Shima | H01L 31/18 |
| 2004/0140365 A1 | 7/2004 | Izuta | |
| 2004/0221880 A1 * | 11/2004 | Tomita | B08B 3/10 |
| | | | 134/102.1 |
| 2008/0017313 A1 | 1/2008 | Kim et al. | |
| 2008/0035609 A1 * | 2/2008 | Kashkoush | H01L 21/31111 |
| | | | 216/84 |
| 2008/0073030 A1 | 3/2008 | Yoshino | |
| 2008/0179293 A1 * | 7/2008 | Wei | H01L 22/20 |
| | | | 216/84 |
| 2012/0247505 A1 * | 10/2012 | Brown | H01L 21/31111 |
| | | | 156/345.19 |
| 2012/0248061 A1 * | 10/2012 | Brown | H01L 21/30612 |
| | | | 156/345.11 |
| 2012/0289056 A1 * | 11/2012 | Bergman | H01L 21/31111 |
| | | | 252/79.4 |
| 2013/0157427 A1 | 6/2013 | Cho et al. | |
| 2014/0277682 A1 | 9/2014 | Siefering et al. | |
| 2016/0042981 A1 | 2/2016 | Sato et al. | |

FOREIGN PATENT DOCUMENTS

| | | | | |
|---|---|---|---|---|
| JP | 7-58078 A | 3/1995 | | |
| JP | 9-69510 | 3/1997 | | |
| JP | 2000-147474 A | 5/2000 | | |
| JP | 2002-231683 A | 8/2002 | | |
| JP | 2003-224106 | 8/2003 | | |
| JP | 2004-260085 A | 9/2004 | | |
| JP | 2004-327826 A | 11/2004 | | |
| JP | 2006-278393 | 10/2006 | | |
| JP | 4001575 | 10/2007 | | |
| JP | 2007-324567 A | 12/2007 | | |
| JP | 2008-84903 | 4/2008 | | |
| JP | 2008-147637 A | 6/2008 | | |
| JP | 2008-198974 A | 8/2008 | | |
| JP | 2009-238802 | 10/2009 | | |
| JP | 4393021 B2 * | 1/2010 | | C09K 13/08 |
| JP | 2010-82558 A | 4/2010 | | |
| JP | 2010-103379 | 5/2010 | | |
| JP | 2011-129741 | 6/2011 | | |
| JP | 4966223 | 7/2012 | | |
| JP | 5035913 | 9/2012 | | |
| JP | 2013-128109 | 6/2013 | | |
| JP | 2013-168563 | 8/2013 | | |
| JP | 2013-251383 A | 12/2013 | | |
| JP | 2016-9729 | 1/2016 | | |
| JP | 2016-39352 | 3/2016 | | |

* cited by examiner

SUBSTRATE TREATMENT APPARATUS AND SUBSTRATE TREATMENT METHOD

CROSS-REFERENCE TO RELATED APPLICATIONS

This application is a divisional of U.S. patent application Ser. No. 15/254,505, which is based upon and claims the benefit of priority from Japanese Patent Application No. 2016-86377, filed on Apr. 22, 2016; the entire contents of which are incorporated herein by reference.

FIELD

Embodiments of the present invention relate to a substrate treatment apparatus and a substrate treatment method.

BACKGROUND

A substrate including a silicon nitride film and a silicon oxide film may be carried out etching of the silicon nitride film alternatively to the silicon oxide film. In this case, phosphoric acid solution is generally used as an etching solution. In such etching, if a silicon compound is added to the phosphoric acid solution, silica concentration in the phosphoric acid solution becomes high, and it can improve the selection ratio of the silicon nitride film to the silicon oxide film.

However, if silicon concentration is too high, the silica concentration is easily saturated and the silica may deposit to the substrate immersed in the phosphoric acid solution.

DETAILED DESCRIPTION

Embodiments will now be described with reference to the accompanying drawings. The present invention is not limited to the embodiments.

A First Embodiment

Figure 1:
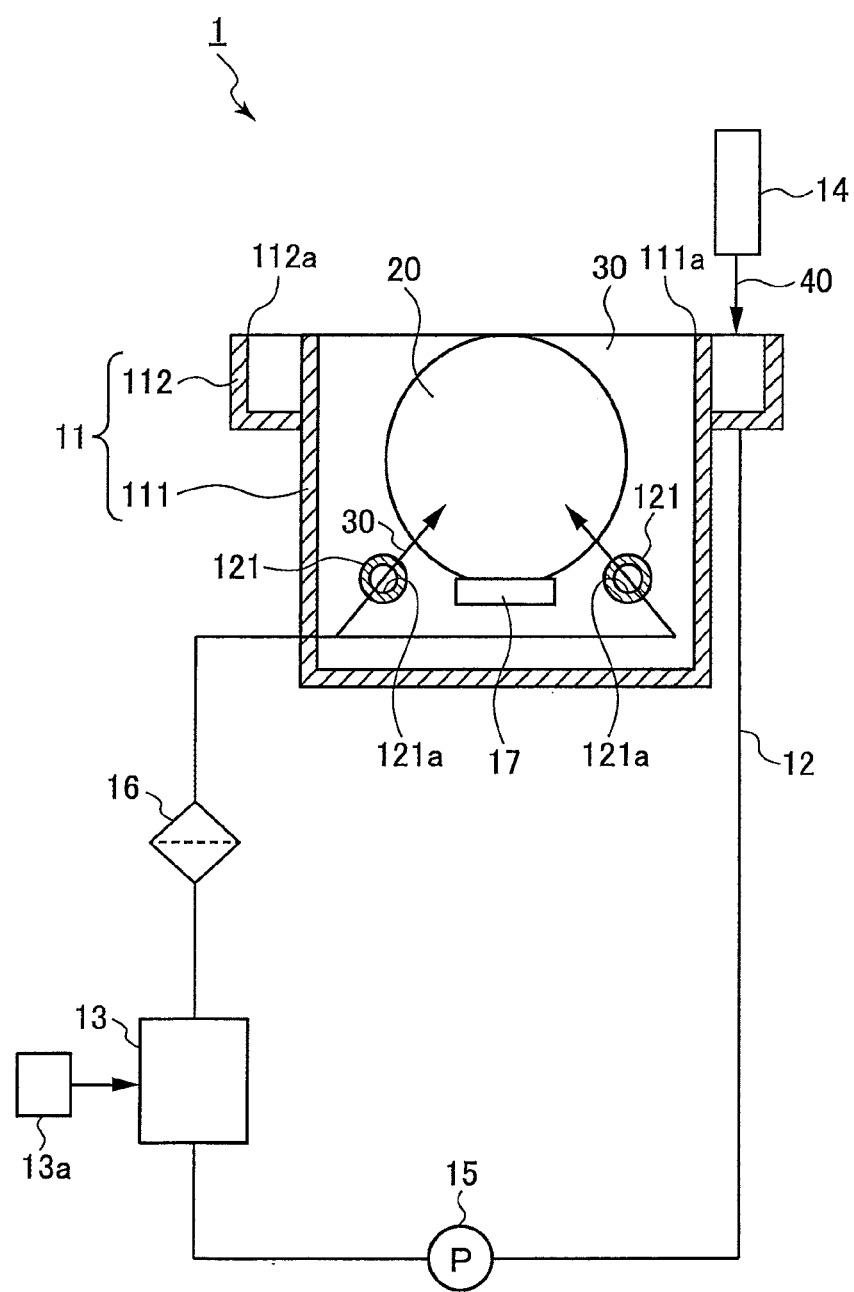
FIG. 1 is a schematic view showing a structure of a substrate treatment apparatus according to a first embodiment.

FIG. 1 is a schematic view showing a structure of a substrate treatment apparatus according to a first embodiment. For example, a substrate treatment apparatus 1 according to the present embodiment is a wet etching apparatus which removes a silicon nitride film (not shown in FIG. 1) in a substrate 20 with a solution 30 (henceforth phosphoric acid solution) containing phosphoric acid. As shown in FIG. 1, the substrate treatment apparatus 1 includes a housing 11, a circulation path 12, a heater 13, a supply unit 14, a pump 15, a filter 16 and a lifter 17.

The housing 11 has an inner housing 111 and an outer housing 112. The inner housing 111 is formed in the box type which has an upper opening 111a. The inner housing 111 stores the phosphoric acid solution 30, i.e., the etching solution of the silicon nitride film in its inside. A temperature, phosphoric acid concentration, and silica concentration of the phosphoric acid solution 30 stored inside the inner housing 111, are optimized to etching of the silicon nitride film in the substrate 20.

The inner housing 111 can store the substrate 20 of a wafer form (circular form). If the substrate 20 is immersed in the phosphoric acid solution 30, the silicon nitride film in the substrate 20 will dissolve in the phosphoric acid solution 30, and will be removed.

The outer housing 112 has an upper opening 112a which surrounds all-round the upper opening 111a of the inner housing 111. The outer housing 112 collects the phosphoric acid solution 30 overflowing from the upper opening 111a of the inner housing 111.

The circulation path 12 communicates with the bottom of the outer housing 112 and the bottom of the inner housing 111, and circulates the phosphoric acid solution 30 to the housing 11. Specifically, the circulation path 12 flows back the phosphoric acid solution 30 which flows out to the outer housing 112 to the inner housing 111. In process of this flowing back, the phosphoric acid solution 30 goes through the heater 13, the pump 15 and the filter 16.

The heater 13 is formed in the middle of the circulation path 12. The heater 13 heats the phosphoric acid solution 30 over a normal boiling point of the phosphoric acid solution 30. The normal boiling point is the boiling point in the case that the external pressure is 1 atmosphere. For example, the heater 13 is a line heater which has a halogen lamp as a heat source.

In the present embodiment, a heating control part 13a adjusts the heating temperature of the heater 13 so that the phosphoric acid solution 30 may be heated at a constant temperature. The phosphoric acid solution 30 heated by the heater 13, i.e., heated solution is supplied to the inside of the inner housing 111 via the filter 16.

The supply unit 14 is located above the outer housing 112. The supply unit 14 supplies water to the outer housing 112. The concentration of the phosphoric acid solution 30 collected in the outer housing 112 may be changed due to boil and etching in the inner housing 111. Therefore, in order to adjust the concentration of the phosphoric acid solution 30 which flows back to the inner housing 111 to the optimal concentration for alternative etching of the silicon nitride film, a water 40 is supplied from the supply unit 14.

In addition, the supply unit 14 may supply phosphoric acid to the outer housing 112 instead of the water 40 for the above-described concentration adjustment. Or the supply unit 14 may supply phosphoric acid solution to the outer housing 112, wherein the supply phosphoric acid solution is adjusted beforehand to the optimal concentration for the etching of the silicon nitride film, i.e., the same phosphoric acid concentration as the phosphoric acid solution 30 initially stored in the inner housing 111 (before the heated solution is supplied). In the present embodiment, the temperature of water, the phosphoric acid, or the phosphoric acid solution is preferably lower than that of the phosphoric acid solution 30 stored in the inner housing 111 so that the bumping may not occur in the outer housing 112.

The pump 15 is located upstream from the heater 13 on the circulation path 12. The pump 15 draws the phosphoric acid solution 30 from the outer housing 112, thereby the phosphoric acid solution 30 collected by the outer housing 112 moves to the heater 13. Moreover, the pump 15 pressurizes the phosphoric acid solution 30 heated by the heater 13, thereby this phosphoric acid solution 30 is supplied to the inner housing 111.

The filter 16 is located downstream from the heater 13 on the circulation path 12. The filter 16 removes a particle contained in the phosphoric acid solution 30 in the circulation path 12. For example, this particle also contains the silica which deposited by the etching of the substrate 20. The filter 16 may be located upstream from the heater 13 on the circulation path 12.

Figure 2:
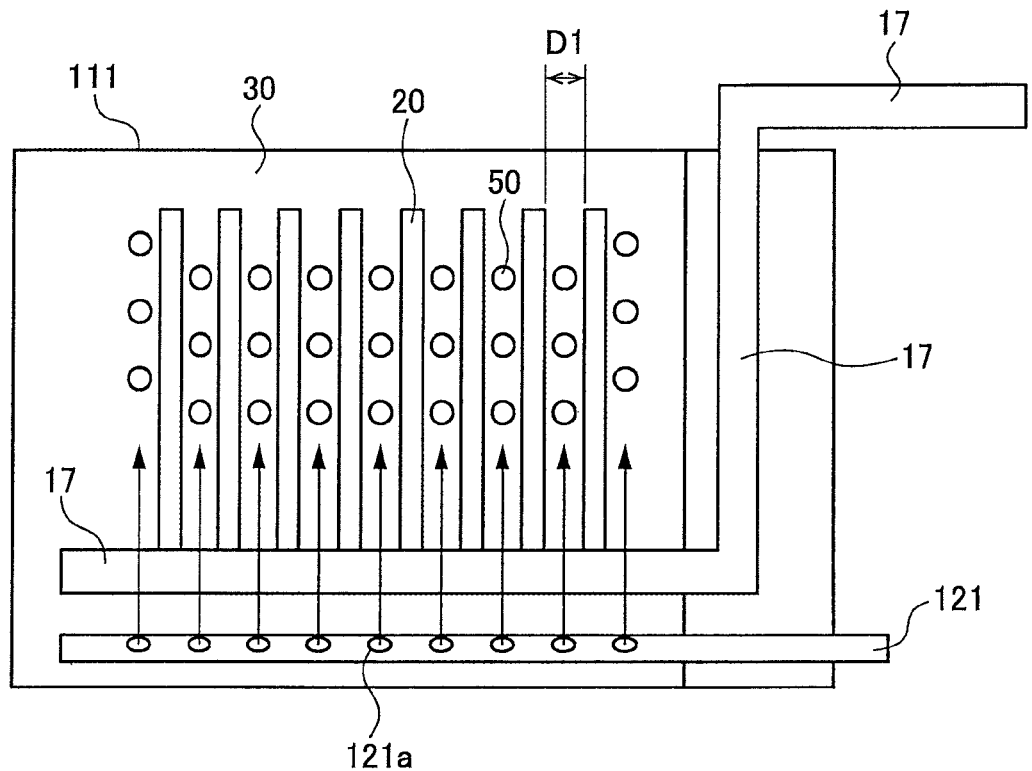
FIG. 2 is a schematic view showing an inside of an inner housing.

FIG. 2 is a schematic view showing the inside of the inner housing 111. As shown in FIG. 2, in the inner housing 111, the lifter 17 holds a plurality of substrates 20 located in a row at the interval D1 (a first interval). Moreover, the lifter 17 moves these substrates 20 in a vertical direction to the inner housing 111. This up and down move makes it possible to automatically immerse the substrates 20 before the etching into the phosphoric acid solution 30 stored in the inner housing 111 and to automatically take out the substrates 20 after the etching from the inner housing 111.

Moreover, as shown in FIG. 2, a pipe 121 is located at the bottom of the inner housing 111. In addition, FIG. 2 shows only one pipe 121. However, another pipe 121 is located at the back side of the pipe 121 indicated in FIG. 2. There are no restrictions in the number of pipes.

Figure 3:
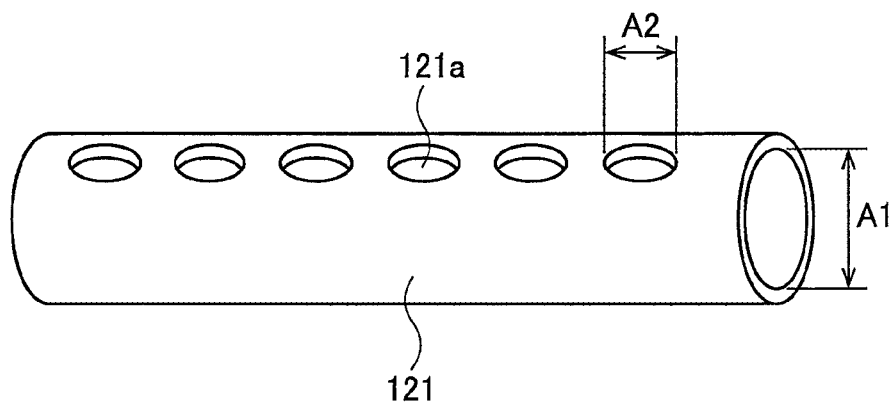
FIG. 3 is a schematic perspective view showing a structure of a pipe.

FIG. 3 is a perspective view schematically showing a structure of the pipe 121. The pipe 121 is included in a part of an exit side of the above-described circulation path 12. A peripheral face of the pipe 121 has a row of a plurality of openings 121a which communicate with the inside of the inner housing 111. These openings 121a are staggered with the substrates 20 along the row of the substrates 20 (horizontal direction), and are located at mostly equal intervals. Therefore, when the phosphoric acid solution 30 heated by the heater 13 is discharged from each of the openings 121a, the flow of the phosphoric acid solution 30 which passes through between the substrates 20 from the bottom of the inner housing 111 occurs (refer to arrows of FIG. 2). A form of the opening 121a does not need to be a perfect circle.

Moreover, when the phosphoric acid solution 30 heated by the heater 13 boils in the inner housing 111, air bubbles 50 are generated. These air bubbles 50 move between the substrates 20 along with the flow of the phosphoric acid solution 30. In order to uniformly generate these air bubbles 50, the interval between any two of the neighboring openings 121a along the above-described row is preferably equal to an interval D1 of the substrates 20.

Figure 4:
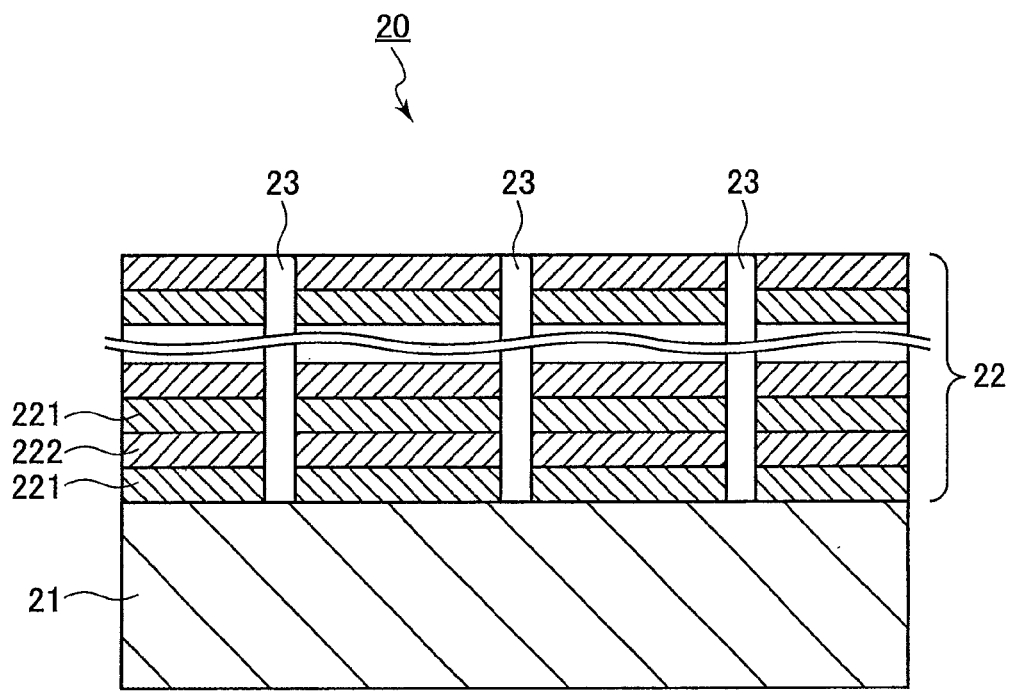
FIG. 4 is a sectional view of a substrate which is an object of etching.

Hereinafter, the substrate treatment method using the substrate treatment apparatus 1 according to the present embodiment is described. FIG. 4 is a sectional view of the substrate 20 which is an object of the etching. This substrate 20 is a semiconductor substrate for manufacturing a laminated type memory on which an electrode layer has been laminated.

As shown in FIG. 4, the substrate 20 has a silicon substrate 21 and a lamination film 22. In the lamination film 22, a silicon oxide film 221 and a silicon nitride film 222 are alternately laminated. Moreover, the substrate 20 has a trench 23 which penetrates the lamination film 22.

If the substrate 20 is housed in the inner housing 111 by the lifter 17, the phosphoric acid solution 30 stored in the inner housing 111 permeates into the lamination film 22 from the trench 23. Thereby, the silicon nitride film 222 is removed. At this time, the silica concentration becomes high. An electrode layer is formed in a part where the silicon nitride film 222 has been removed by another processing.

The phosphoric acid solution 30 overflowing from the inner housing 111 is collected by the outer housing 112. The phosphoric acid solution 30 collected by the outer housing 112 is drawn with the pump 15, and is sent to the heater 13.

The heater 13 heats the phosphoric acid solution 30 over the normal boiling point. The phosphoric acid solution 30 heated by the heater 13 is discharged by the pump 15, from the opening 121a of the pipe 121 to the inside of the inner housing 111. At this time, the pump 15 is pressurizing the phosphoric acid solution 30 so that the phosphoric acid solution 30 does not boil in the pipe 121. As a result, when the phosphoric acid solution 30 is supplied to the inside of the inner housing 111, the flow of the phosphoric acid solution 30 and the air bubbles 50 are generated (refer to FIG. 2).

Figure 5:
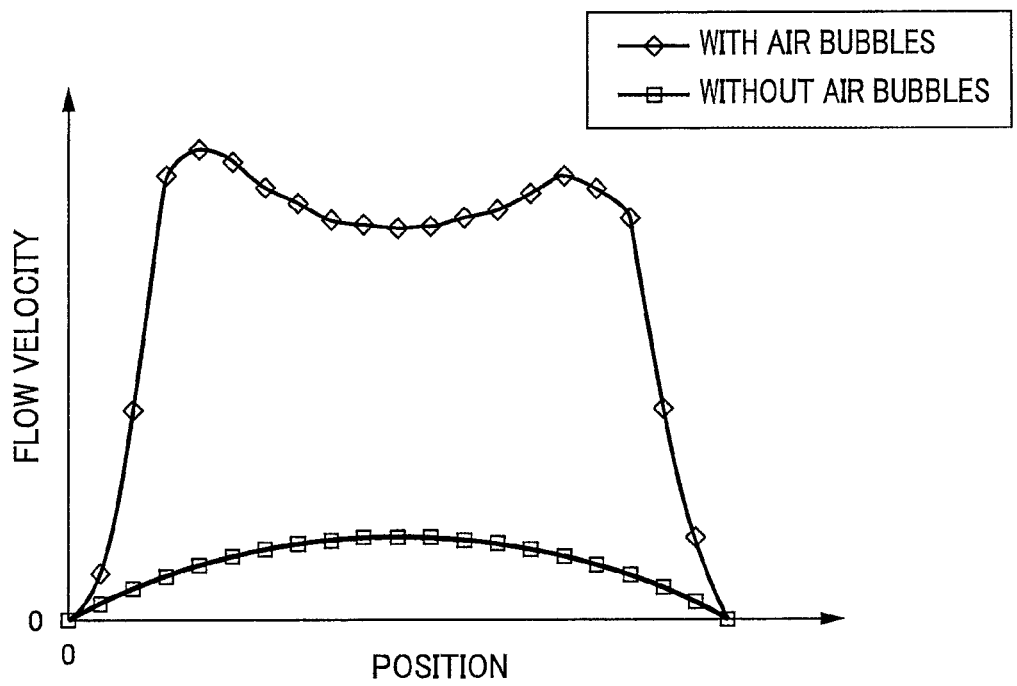
FIG. 5 is a distribution graph of a flow velocity of phosphoric acid solution in the inner housing.

FIG. 5 is a distribution graph of a flow velocity of the phosphoric acid solution 30 in the inner housing 111. FIG. 5 shows a distribution of the flow velocity with the air bubbles 50, and a distribution of the flow velocity without the air bubbles 50.

In FIG. 5, a horizontal axis shows a horizontal position in the inner housing 111 when the inner housing 111 is seen from the side (refer to FIG. 1). In other words, FIG. 5 shows the distribution of the flow velocity of the phosphoric acid solution 30 on the substrate 20 (wafer).

As shown in FIG. 5, when there are not the air bubbles 50, the flow velocity of the phosphoric acid solution 30 on the substrate 20 is small. In the substrate 20, if the number of laminations of the silicon nitride film 222 increases by the memory capacitance increase, the quantity of the silicon nitride film 222 which dissolves into the phosphoric acid solution 30 will increase. In other words, the amount of the silica dissolved into the phosphoric acid solution 30 will increase. Therefore, the silica deposits easily within the trench 23, and if the flow velocity of the phosphoric acid solution 30 is small, the deposit of the silica will be promoted in the trench 23.

On the other hand, when there are the air bubbles 50 like the present embodiment, the flow velocity of the phosphoric acid solution 30 becomes large compared with the case where there are not the air bubbles 50. That is, the flow of the phosphoric acid solution 30 is accelerated by the air bubbles 50. Thereby, removal of the silica from the substrate 20 is promoted. That is, discharge of the silica dissolved in the trench 23 is promoted by the flow velocity of the phosphoric acid solution 30 near the surface of the substrate 20.

A diameter d and a speed V of the air bubbles 50 can be calculated by using a following equation of motion (1) and an approximate expression (2) of a following drag C. "g" indicated at the following expression (1) shows gravity acceleration, and "Re" indicated at the following expression (2) shows Reynolds number. This Reynolds number can be calculated by using a following expression (3). "v" indicated at the expression (3) shows the kinetic viscosity of phosphoric acid.

$$\frac{4gd}{3} = CV^2 \quad (1)$$

$$C = \left(0.55 + \frac{4.8}{\sqrt{Re}}\right)^2 \quad (2)$$

$$Re = \frac{Vd}{v} \quad (3)$$

According to the above-described expressions (1) to (3), for example, when the diameter d is 0.5 mm, the speed V is 0.04 m/s, and when the diameter d is 50 mm, the speed V is 1.4 m/s.

Figure 6:
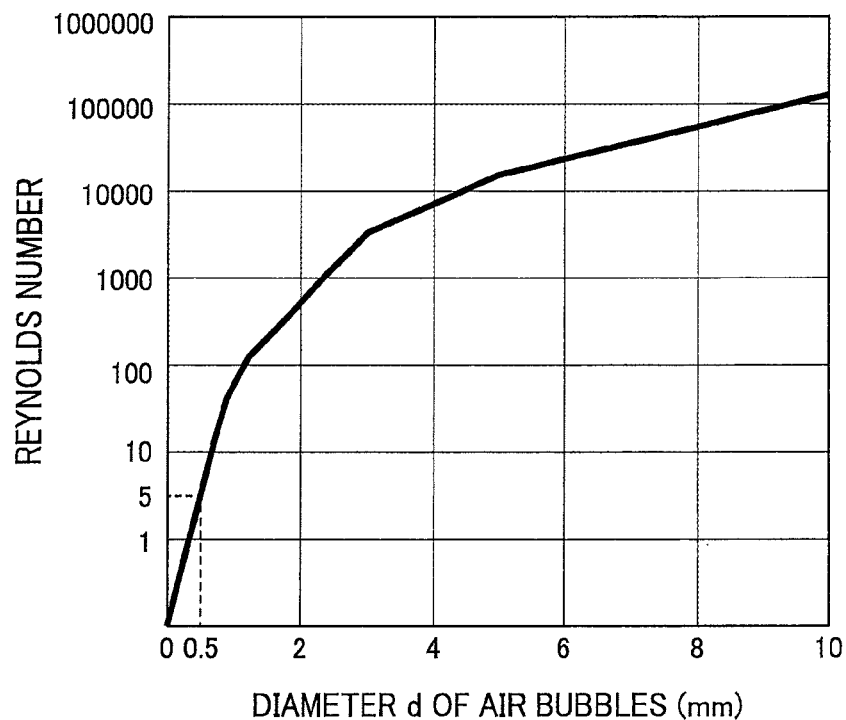
FIG. 6 is a graph showing a relationship between Reynolds number and a diameter of air bubbles.

FIG. 6 shows a graph which shows a relationship between the Reynolds number and the diameter d of the air bubbles 50. According to FIG. 6, if the diameter d of the air bubbles 50 is more than 0.5 mm, the Reynolds number will be larger than 5. If the Reynolds number is larger than 5, Karman vortex will occur. If the Karman vortex occurs, various flows will newly occur after the air bubbles 50 have passed, thereby the phosphoric acid solution 30 is agitated. Therefore, the removal of the silica from the substrate 20 can further be promoted.

In order to improve the removal effect of the silica as described above, the diameter d of the air bubbles 50 is preferably larger than 0.5 mm. In order for such the air bubbles 50 to move between the substrates 20, the interval D1 (refer to FIG. 2) of the substrates 20 is preferably larger than at least 0.5 mm. Moreover, in order for the air bubbles 50 to stably move between the substrates 20, the diameter d of the air bubbles 50 is preferably smaller than the interval D1.

Moreover, in the substrate treatment apparatus 1 according to the present embodiment, the heater 13 heats the phosphoric acid solution 30 which circulates through the circulation path 12 over the normal boiling point. For example, the phosphoric acid solution 30 with 85% by weight boils at about 163 deg C. If water is added to this phosphoric acid solution 30, the normal boiling point will fall. However, when the pressure over the external pressure is applied to this phosphoric acid solution 30 in the circulation path 12, the phosphoric acid solution 30 can be hard to boil in the circulation path 12.

A pressure P applied to the phosphoric acid solution 30 in the circulation path 12 can be calculated by a following expression (4) by using Bernoulli's theorem. In the following expression (4), "ρ" shows phosphoric acid density and "v" shows the flow velocity of the phosphoric acid solution 30 in the circulation path 12.

$$P = \frac{\rho v^2}{2} \quad (4)$$

For example, when the flow velocity v is 1.0 m/s, the pressure P applied to the phosphoric acid solution 30 is 0.8 kPa. This pressure is applied by using the pump 15.

Figure 7:
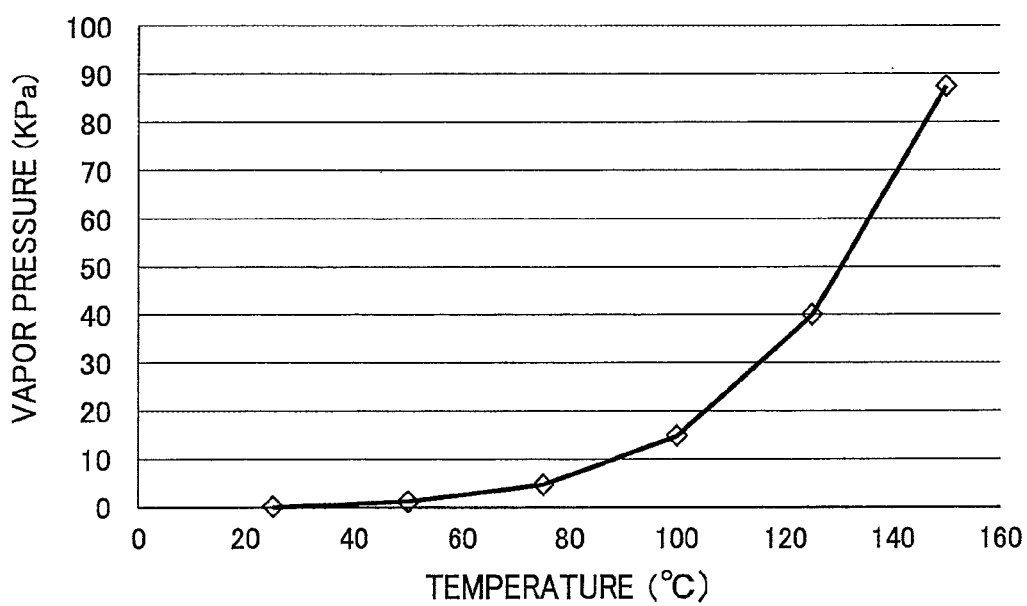
FIG. 7 is a graph showing a vapor pressure curve with 85% by weight of the phosphoric acid solution.

FIG. 7 is a graph showing a vapor pressure curve with 85% by weight of phosphoric acid solution. According to the graph shown in FIG. 7, when the phosphoric acid solution 30 flows through the circulation path 12 on condition that the pressure is 0.8 kPa and the flow velocity is 1.0 m/s, it is presumed that the boiling point goes up about 0.3 deg C.

Figure 8:
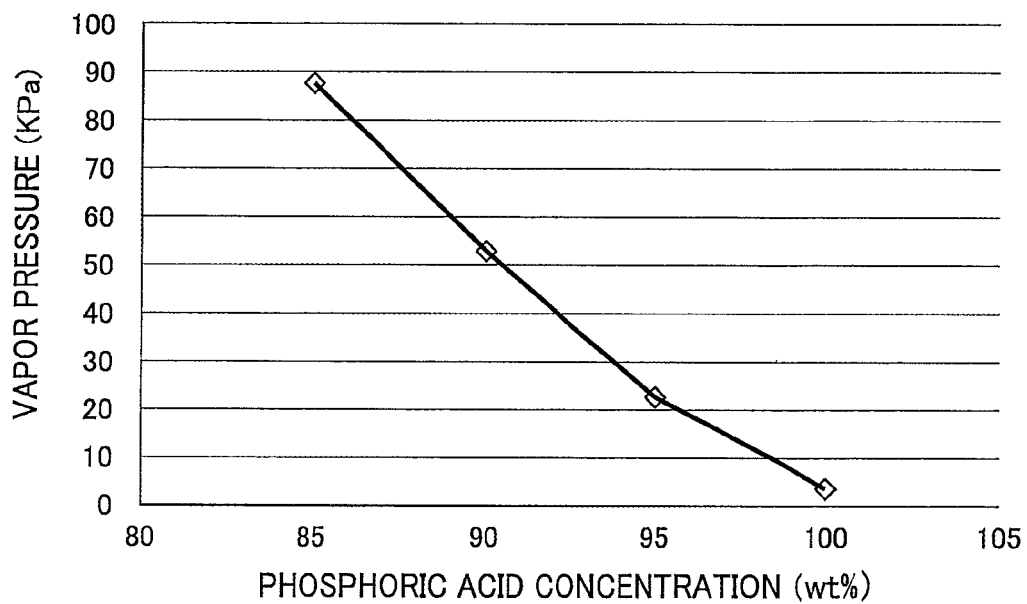
FIG. 8 is a graph showing a relationship between phosphoric acid concentration and vapor pressure.

FIG. 8 is a graph showing a relationship between the phosphoric acid concentration and vapor pressure. When the vapor pressure is 0.8 kPa, according to the graphs shown in FIG. 7 and FIG. 8, respectively, it is presumed that the phosphoric acid solution 30 does not boil in the circulation path 12 even if phosphoric acid concentration falls 0.15% by weight.

As described above, when the pump 15 controls the pressure applied to the phosphoric acid solution 30 on the circulation path 12 so as to be higher than the pressure applied to the phosphoric acid solution 30 in the inner housing 111, the phosphoric acid solution 30 heated at over the normal boiling point cannot be boiled on the circulation path 12, but can be boiled at the inner housing 111. Thereby, the air bubbles 50 are not generated in the circulation path 12, but the phosphoric acid solution 30 can smoothly flow through in the circulation path 12, and can generate the air bubbles 50 in the inner housing 111.

Moreover, the pressure applied to the phosphoric acid solution 30 on the circulation path 12 can be adjusted also by adjusting a ratio A1/A2 between an inside diameter A1 of the pipe 121 and a diameter of the opening 121*a* shown in FIG. 3.

Figure 9:
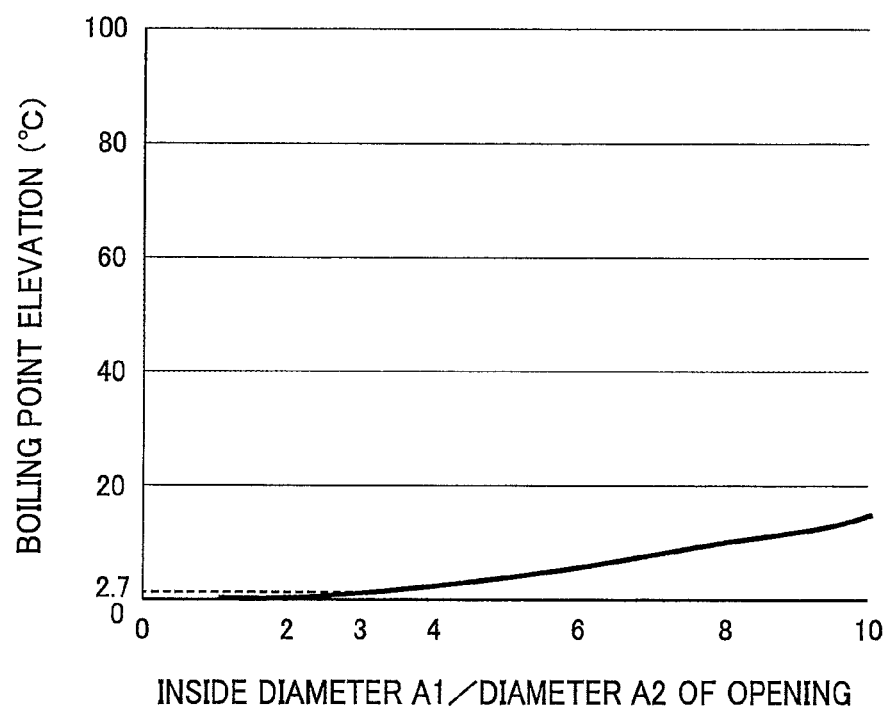
FIG. 9 is a graph showing an example of a relationship between a ratio of an inside diameter A1 and a diameter of an opening, and a boiling point elevation of a phosphoric acid solution 30.

FIG. 9 is a graph showing an example of a relationship between the ratio of the inside diameter A1 of the pipe 121 to the diameter of the opening 121*a*, and boiling point elevation of the phosphoric acid solution 30. If the ratio between the inside diameter A1 and the diameter is nearly 1, it will become difficult to increase inner pressure of the pipe 121. Therefore, according to FIG. 9, for example, when the ratio A1/A2 is less than 3, change of the boiling point stays within 2.7 deg C. rise.

On the other hand, when the ratio A1/A2 is ten or more, the inner pressure of the pipe 121 is high, but the pressure loss of the pipe 121 is large, thereby there is a high possibility of failing to supply the phosphoric acid solution 30. Therefore, it is desirable for the ratio A1/A2 to be within the range of 3-10. Thus, by adjusting the ratio A1/A2 of the inside diameter A1 of the pipe 121 to the diameter of the opening 121*a*, the pressure added to the phosphoric acid solution 30 is controlled within the pipe 121, and the phosphoric acid solution 30 heated by the heater 13 can be boiled when discharged to the inner housing 111 from the opening 121*a*. That is, the air bubbles 50 can be generated in the inner housing 111.

(Example of Experiment)

Hereinafter, an experiment example which the investigated deposit of the silica is described. In this experiment example, the phosphoric acid solution was supplied from the opening 121*a* of the pipe 121 to the inner housing 111. Here, this phosphoric acid solution was heated so as to boil at 160 deg C., and the inner housing 111 stored the phosphoric acid solution 30 whose concentration adjustment was carried out at about 160 deg C. As a result, by boil of the supplied phosphoric acid solution, the air bubbles 50 were generated, whose diameters d were within the range of 0.5 mm to 50 mm. After that, the substrate 20 was immersed into the boiling phosphoric acid solution during a predetermined period. Furthermore, after treatment by alkaline solution, rinse treatment by pure water and drying treatment were carried out to the substrate 20, and after that, the treated substrate 20 was observed by SEM (Scanning Electron Microscope). As a result, the deposit of the silica was not observed on the whole surface of the substrate 20.

Comparative Example

Next, the phosphoric acid solution was supplied from the opening 121a of the pipe 121 to the inner housing 111. Here, the temperature adjustment of this phosphoric acid solution was carried out so as not to boil at 160 deg C., and the inner housing 111 stored the phosphoric acid solution 30 of which concentration adjustment was carried out at 160 deg C. After that, the substrate 20 was immersed into the phosphoric acid solution which has not been boiled during the predetermined period. Furthermore, the above-described treatments were carried out to the substrate 20, and after that, the treated substrate 20 was observed by SEM. As a result, the deposit of the silica was observed on a part of the substrate 20. This result is considered to be due to the flow of the phosphoric acid solution which has not been accelerated by the air bubbles 50 in the inner housing 111.

As described above, according to the present embodiment, the air bubbles 50 are generated in the inner housing 111 by supplying the phosphoric acid solution heated at over the normal boiling point to the inner housing 111. These air bubbles 50 accelerate the flow velocity of the phosphoric acid solution flowing in the inner housing 111, and thereby the discharge effect of the silica depositing to the substrate 20 can improve. As a result, for example, when the substrate 20 is used for a laminated type memory, the manufacture yield of the laminated type memory can improve. In addition, the air bubbles 50 may be generated by boil of the phosphoric acid solution 30 and also may be generated by supplying high-pressure air and inactive gas from the lower part of the inner housing 111.

Moreover, by controlling the pressure applied to the phosphoric acid solution 30 on the circulation path 12 to become higher than the pressure applied to the phosphoric acid solution 30 in the inner housing 111, the phosphoric acid solution 30 heated by the heater 13 cannot be boiled in the circulation path 12, but can be boiled in the inner housing 111. Thereby, circulation of the phosphoric acid solution 30 can be made smooth.

The Second Embodiment

Figure 10:
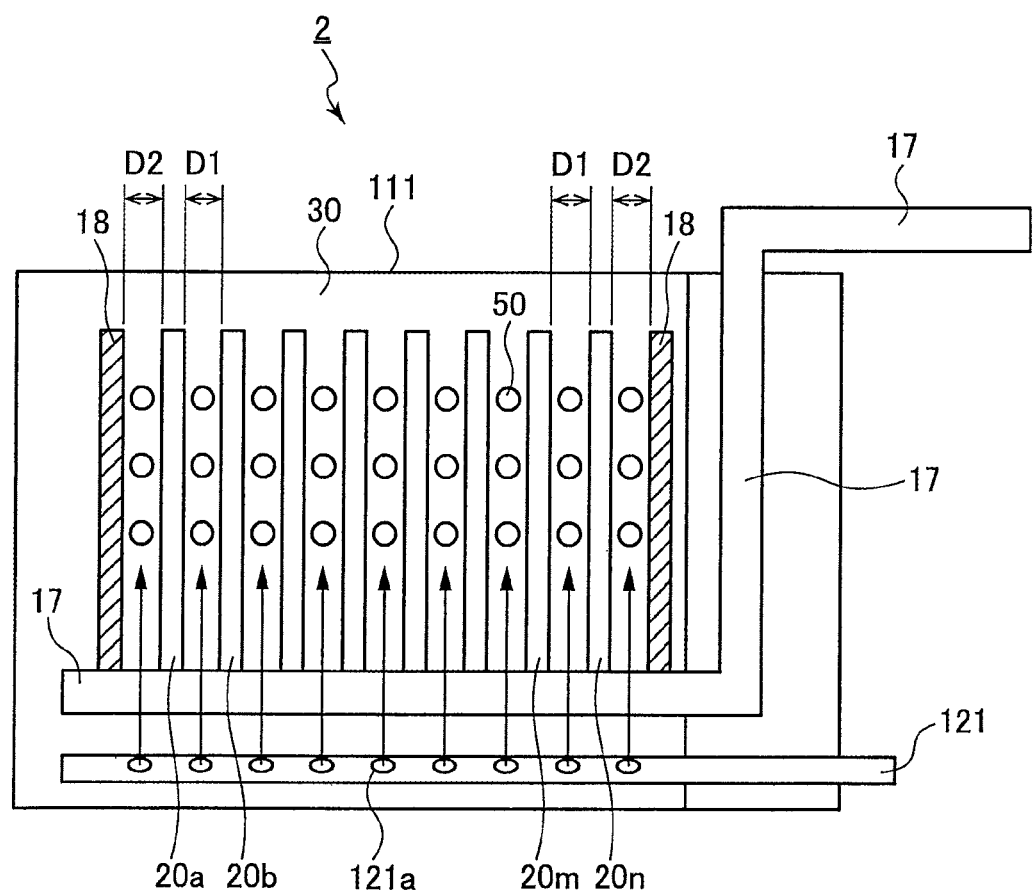
FIG. 10 is a schematic view showing a structure of a main part of a substrate treatment apparatus according to a second embodiment.

FIG. 10 is a schematic view showing a structure of a main part of a substrate treatment apparatus according to a second embodiment. Hereinafter, constituent parts similar to the above-described substrate treatment apparatus 1 according to the first embodiment are denoted by the same reference numerals and will not be described in detail here.

As shown in FIG. 10, in addition to a component of the substrate treatment apparatus 1 according to the first embodiment, the substrate treatment apparatus 2 according to the present embodiment newly includes a plate member 18. On the lifter 17, the plate member 18 faces a substrate 20a (a first substrate 20) and a substrate 20n (an Nth substrate), respectively. The substrate 20a and the substrate 20n are located at both ends of a row of the substrates consisting of the N (where N is a natural number equal to 2 or more) substrates 20. The material of the plate member 18 is, for example, quartz, or Teflon (registered trademark) etc. which has the tolerance for high-temperature (for example, 160 deg C.) phosphoric acid. The plate member 18 may be a dummy substrate (wafer) which is not an object of etching.

Regarding the substrate 20a and the substrate 20n, even though one surface respectively faces the substrates 20b and 20m which neighbor the substrates 20a and 20n, if the other surface does not face other substrates, the flow of the air bubbles 50, in other words, the movement speed thereof will differ between the two surfaces of the substrates 20a and 20n. Thereby the substrates 20a and 20n are likely to be exposed to stress. If this stress is great, the substrates 20a and 20n may be damaged.

Therefore, in the present embodiment, the plate member 18 functions as a current plate to uniform the flow of the air bubbles 50 on both surfaces of the substrates 20a and 20n. In order for the plate member 18 to function as such the current plate, an interval D2 between the plate member 18 and the substrate 20a, and an interval D2 between the plate member 18 and substrate 20n, are preferably almost equal to the interval D1 of the substrates 20. Here, the interval D1 almost equal to the interval D2 is defined as the relationship between the interval D1 and the interval D2 where the interval D1 and the interval D2 may be equal or the difference thereof is within a range where the substrates 20a and 20n are not at risk of damage.

Moreover, in order for the phosphoric acid solution 30 to flow more uniformly on each of the both surfaces of the substrates 20a and 20n, a plane area of the plate member 18 is preferably larger than that of the substrate 20a, and also that of the substrate 20n.

In addition, in the present embodiment, the plate member 18 is formed in a rectangle. However, the plate member 18 may be a circular form same as the substrate 20, or may be other forms. Moreover, in order for the air bubbles 50 to move smoothly, the surfaces (which face the substrates 20a and 20n, respectively) of the plate members 18 are preferable to be flat.

Figure 11:
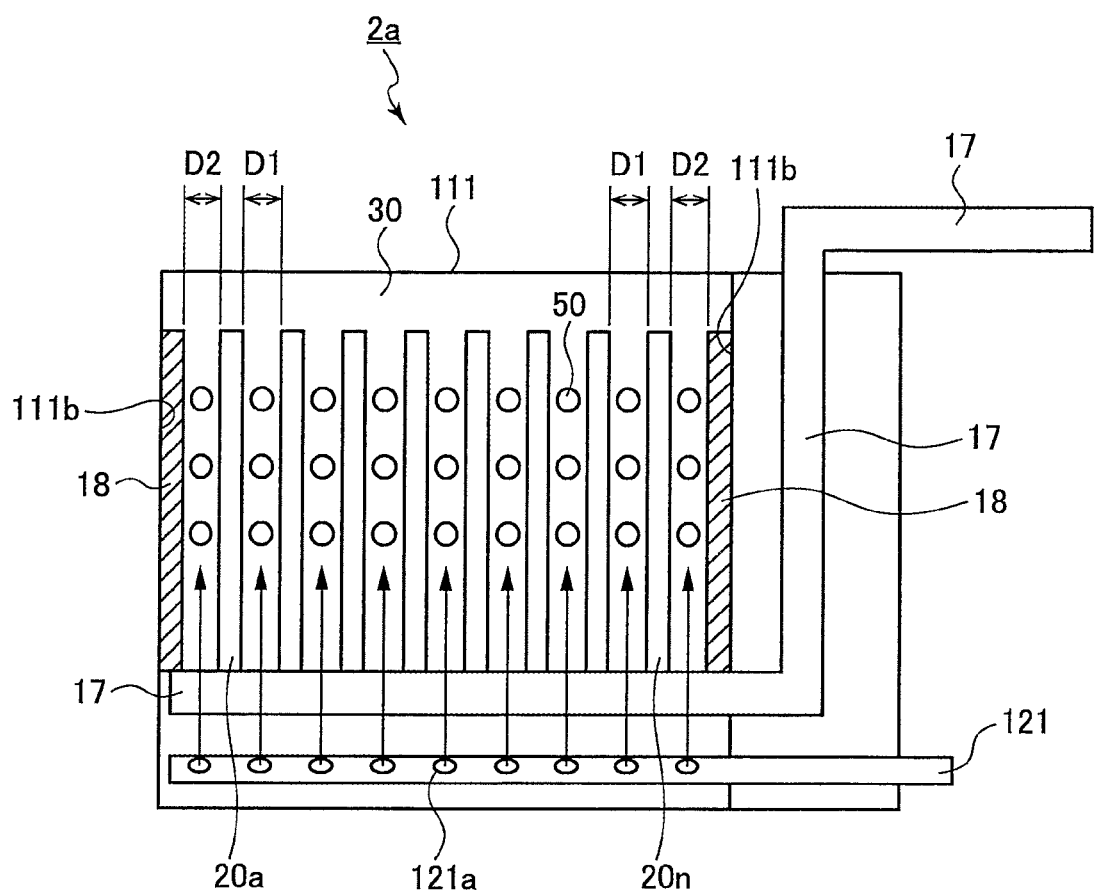
FIG. 11 shows a modification example of the substrate treatment apparatus according to the second embodiment.

Moreover, in the present embodiment, the plate member 18 is attached to the lifter 17. However, as shown in FIG. 11, the plate member 18 may be located in the inner housing 111. In a substrate treatment apparatus 2a shown in FIG. 11, the plate members 18 are attached to internal surfaces 111b of the inner housing 111, wherein the surfaces 111b face the substrates 20a and 20n, respectively. The relationship of almost equality between the interval D1 and the interval D2 allows that the plate member 18 of the substrate treatment apparatus 2a also functions as the above-described current plate.

Figure 12:
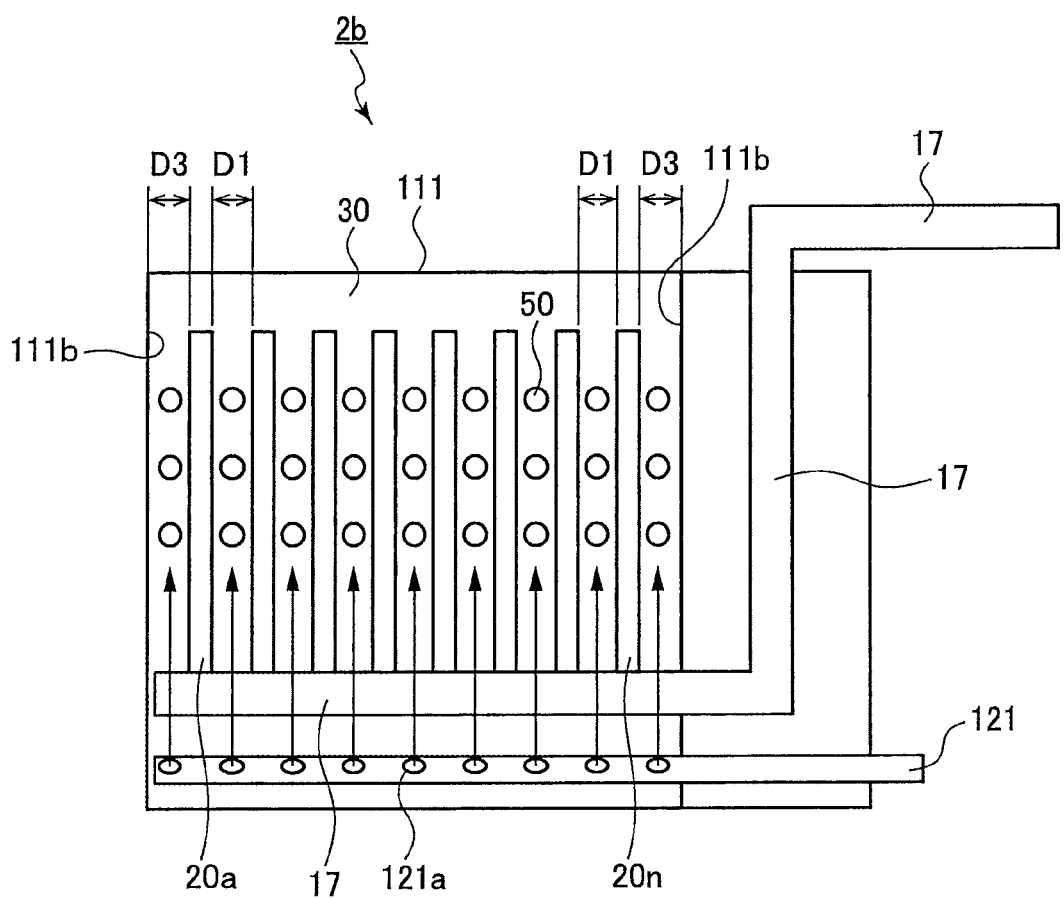
FIG. 12 shows another modification example of the substrate treatment apparatus according to the second embodiment.

Furthermore, as shown in FIG. 12, the internal surfaces 111b themselves of the inner housing 111 may function as the above-described current plate. In this case, an interval D3 between the substrate 20a and one of the internal surfaces 111b facing this substrate 20a, and an interval D3 between the substrate 20n and the other of the internal surfaces 111b facing this substrate 20n, are almost equal to the interval D1, respectively.

According to the present embodiment described above, the phosphoric acid solution 30 heated at over the normal boiling point is supplied to the inner housing 111, same as the first embodiment. The air bubbles 50 generated at this time can improve the discharge effect of the silica depositing to the substrate 20. In addition, in the present embodiment, the air bubbles 50 may be generated by boil of the phosphoric acid solution 30 and also may be generated by supplying the high-pressure air and the inactive gas from the lower part of the inner housing 111. Furthermore, in the present embodiment, the plate member 18 or the internal surface 111b of the inner housing 111 functions as the current plate which arranges the flow of the air bubbles 50 on both surfaces of the substrates 20 located at the both ends of the row of the substrates. Thereby, the substrates 20 can be hard to damage.

In addition, some substrate treatment apparatuses described above are used to treat the substrate of a laminated type memory. However, these substrate treatment apparatuses can be also applied to treatment of other substrates, for example, a glass substrate for liquid crystal displays, an optical disc substrate, and a substrate for MEMS (Micro Electro Mechanical Systems).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A substrate treatment method comprising:
   providing a housing containing a solution of phosphoric acid and water at a boiling temperature;
   circulating the solution of phosphoric acid and water from an overflow of the housing through a pipe system external to the housing comprising a pump which applies pressure to the solution in the pipe greater than a pressure in the housing and a heating unit which heats the solution to a temperature above a normal boiling point of the solution,
   returning the pressurized and heated solution to a bottom of the housing;
   immersing a plurality of substrates which comprise a silicon nitride film in the boiling solution of the housing;
   etching the substrates to remove silicon nitride to obtain etched substrates;
   removing the etched substrates from the housing; and
   treating the etched substrates with an alkaline solution;
   wherein
   the solution in the pipe is returned to the bottom of the housing through a pipe containing a plurality of openings arranged in intervals of D1,
   the plurality of substrates is arranged in rows arranged vertical to the pipe, and when the solution in the pipe exits through the plurality of openings, the solution boils generating gas bubbles having a diameter d which is from 0.5 mm to less than D1,
   the bubbles rise between the vertical rows of substrates to the surface of the solution,
   the pipe is spaced apart from and under an outer edge of each substrate,
   the plurality of openings is provided on a surface of the pipe in a direction facing the substrates, and
   the rising bubbles flow the phosphoric acid between the substrates.

2. The substrate treatment method according to claim 1, further comprising removing particles from the solution which is circulating in the pipe system;
   wherein
   the pipe system further comprises a filter which removes the particles from the solution.

3. The substrate treatment method according to claim 1, further comprising adding water or phosphoric acid to the solution in the overflow of the housing to adjust the concentration of phosphoric acid in the solution of phosphoric acid and water.

4. The substrate treatment method according to claim 1, wherein the interval of the openings is equal to that of the substrates.

* * * * *